(12) United States Patent
Walling et al.

(10) Patent No.: US 10,965,330 B2
(45) Date of Patent: Mar. 30, 2021

(54) APPARATUSES AND METHODS FOR TUNABLE DIGITAL POWER AMPLIFIERS

(71) Applicant: UNIVERSITY OF UTAH RESEARCH FOUNDATION, Salt Lake City, UT (US)

(72) Inventors: Jeffrey Walling, Salt Lake City, UT (US); Zhidong Bai, Salt Lake City, UT (US); Ali Azam, Salt Lake City, UT (US); Wen Yuan, Salt Lake City, UT (US)

(73) Assignee: UNIVERSITY OF UTAH RESEARCH FOUNDATION, Salt Lake City, UT (US)

(*) Notice: Subject to any disclaimer, the term of this patent is extended or adjusted under 35 U.S.C. 154(b) by 0 days.

(21) Appl. No.: 16/789,096

(22) Filed: Feb. 12, 2020

(65) Prior Publication Data

US 2020/0259512 A1    Aug. 13, 2020

Related U.S. Application Data (60) Provisional application No. 62/804,873, filed on Feb. 13, 2019.

(51) Int. Cl.
| | | |
|---|---|---|
| *H04B 1/04* | (2006.01) | |
| *H03F 1/56* | (2006.01) | |
| *H03F 3/20* | (2006.01) | |

(52) U.S. Cl.
CPC ............. *H04B 1/04* (2013.01); *H03F 1/565* (2013.01); *H03F 3/20* (2013.01); *H03F 2200/387* (2013.01); *H03F 2200/451* (2013.01); *H04B 2001/045* (2013.01)

(58) Field of Classification Search
CPC ..... H04B 1/04; H04B 2001/045; H03F 1/565; H03F 3/20; H03F 2200/387; H03F 2200/451
USPC .................................................... 455/114.3
See application file for complete search history.

(56) References Cited

U.S. PATENT DOCUMENTS

| | | | |
|---|---|---|---|
| 7,183,844 B2 | 2/2007 | Klomsdorf et al. | |
| 7,425,874 B2* | 9/2008 | Risbo .................... | H03L 7/0995 331/1 A |
| 8,618,975 B2* | 12/2013 | Nys ....................... | H03M 1/144 341/172 |

(Continued)

FOREIGN PATENT DOCUMENTS

| | | |
|---|---|---|
| CN | 102427339 A | 4/2012 |
| CN | 104579242 A | 4/2015 |
| CN | 104901641 A | 9/2015 |

OTHER PUBLICATIONS

U.S. Appl. No. 62/804,873, filed Feb. 13, 2019.

(Continued)

*Primary Examiner* — Sonny Trinh
(74) *Attorney, Agent, or Firm* — Dorsey & Whitney LLP (57) ABSTRACT

Embodiments of the disclosure are drawn to apparatuses and methods for a tunable digital power amplifier (DPA). The tunable DPA may be coupled to a reconfigurable capacitor to form a frequency tunable DPA. The capacitance of the reconfigurable capacitor may be adjusted to optimize the DPA to operate at a desired frequency band. The single tunable DPA may operate over a wide range of frequencies.

16 Claims, 8 Drawing Sheets

(56) References Cited

U.S. PATENT DOCUMENTS

| | | | | |
|---|---|---|---|---|
| 8,680,925 | B2* | 3/2014 | Christen | H03F 1/308 330/296 |
| 9,143,172 | B2 | 9/2015 | See et al. | |
| 9,882,587 | B2 | 1/2018 | Feng et al. | |
| 9,973,153 | B2 | 5/2018 | Samelis | |
| 2008/0233898 | A1* | 9/2008 | Rezeq | H03F 3/217 455/106 |
| 2015/0381215 | A1* | 12/2015 | Butterfield | H03F 3/45179 375/295 |
| 2015/0381401 | A1* | 12/2015 | Butterfield | H03F 3/24 375/295 |
| 2016/0164474 | A1* | 6/2016 | Beltran Lizarraga | H03F 3/211 375/219 |
| 2017/0373649 | A1* | 12/2017 | Romme | H03F 3/21 |
| 2018/0076999 | A1 | 3/2018 | Luo et al. | |

OTHER PUBLICATIONS

Bai, et al., "A Frequency Tuneable Switch-Capcitor PA in 65nm CMOS", 2019, pp. 23.

Kim, et al., "A Tunable Power Amplifier Employing Digitally Controlled Accumulation-Mode Varactor Array for 2.4-GHz Short-Range Wireless Communication", IEEE Xplore Digital Library, 2016, 3 pages.

Ko, et al., "A High-Efficiency Multiband Class-F Power Amplifier in 0153 um Bulk CMOS for WCDMA/LTE Applications", IEEE ISSCC Dig. Tech. Papers, 2017, pp. 40-41.

Nai, et al., "A 2.8-6 Ghz High-Efficiency CMOS Power Amplifier With High-Order Harmonic Matching Network", Proc. of the IEEE International Microwave Symposium, 2016, pp. 1-3.

Park, et al., "A 24dBm 2-to-4.3 GHz Wideband Digital Power Amplifier with Built-In AM-PM Distortion Self-Compensation", IEEE ISSCC Dig. Tech. Papers, 2017, pp. 230-231.

Ye, et al., "A 2-to-6GHz Class-AB Power Amplifier with 28.4% PAE in 65nm CMOS Supporting 256QAM", IEEE ISSCC Dig. Tech. Papers, 2015, pp. 38-39.

Yoo, et al., "A Switched-Capacitor RF Power Amplifier", IEEE J. Solid-State Circuits, vol. 46, Dec. 2011, pp. 2977-2987.

* cited by examiner

APPARATUSES AND METHODS FOR TUNABLE DIGITAL POWER AMPLIFIERS

RELATED APPLICATIONS

This application claims priority to U.S. Provisional Application No. 62/804,873, filed on Feb. 13, 2019, the contents of which are incorporated herein by reference for any purpose.

NOTICE

This invention was made with government support under Grant Number 1508701 awarded by the National Science Foundation. The government has certain rights in the invention.

BACKGROUND

This disclosure relates generally to power amplifiers. More specifically, this disclosure relates to digital power amplifiers. Power amplifiers (PA) used in wireless communication transmission must meet stringent linearity and noise requirements in order to leverage the limited spectrum available. Fragmentation of the limited spectrum requires PAs that can operate over multiple narrowband channels across a wide bandwidth. A prior solution to this problem are PAs that operate over a wide bandwidth, but performance, such as peak power, must be sacrificed to ensure a flat, broadband response of the PA. Another prior solution included providing a circuit with multiple PAs, with each PA optimized for a different frequency band, and a user could switch between the PAs to select the desired frequency band. However, this solution requires many components, large layout area, and the optimization of several PAs.

DETAILED DESCRIPTION

The following description of certain embodiments is merely exemplary in nature and is in no way intended to limit the scope of the disclosure or its applications or uses.

In the following detailed description of embodiments of the present apparatuses, systems and methods, reference is made to the accompanying drawings which form a part hereof, and which are shown by way of illustration specific embodiments in which the described apparatuses, systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

An emerging trend in wireless communications systems is to leverage the limited and discrete spectrum available in combination with spectrally efficient modulation. Such modulation schemes result in large peak-to-average power ratios that require power amplifiers (PAs) to operate with stringent linearity and noise requirements to ensure out-of-band (OOB) spectral purity. The fragmentation of the available spectrum requires operation over a wide bandwidth with multiple individual relatively narrowband channels. Two solutions to this problem are common. One option is to use a wideband PA; however, this often sacrifices efficiency in favor of a flat, broadband response. A second approach is to use separate multiband PAs to cover specific bands of interest; this approach requires independent design and optimization for each specific frequency band.

As disclosed herein, a tunable PA/transmitter architecture may be capable of covering a wide range of the spectrum in narrow bandwidth segments using a single efficient narrowband switched capacitor power amplifier (SCPA) coupled to a programmable capacitor array (PCA). In some embodiments, the operating frequency may be tuned by digitally programming the resonant frequency through adjustment of the total capacitance presented by the capacitor array, in series with PCA. To a first order, the PCA may only impacts the resonant frequency of the output network and/or may not impact the output power or efficiency when operating at different frequencies. This may an energy and area efficient approach that may allow for flexible operation of a single PA over a wide contiguous band of frequencies.

In some embodiments, the PCA may be implemented using a commercial-off-the-shelf (COTS) component. In some embodiments, the PCA may be implemented using a back-end-of-line (BEOL) MEMS process. In the former case, the implementation area may be large and potentially more costly, as it may require placement of packaged devices on a PCB; in the latter, the size may be minimized as the BEOL MEMs device is implemented in the same footprint as CMOS circuitry, but the design may be more complex and may require implementation of electrostatically programmable MEMs capacitors and additional processing.

Figure 1:
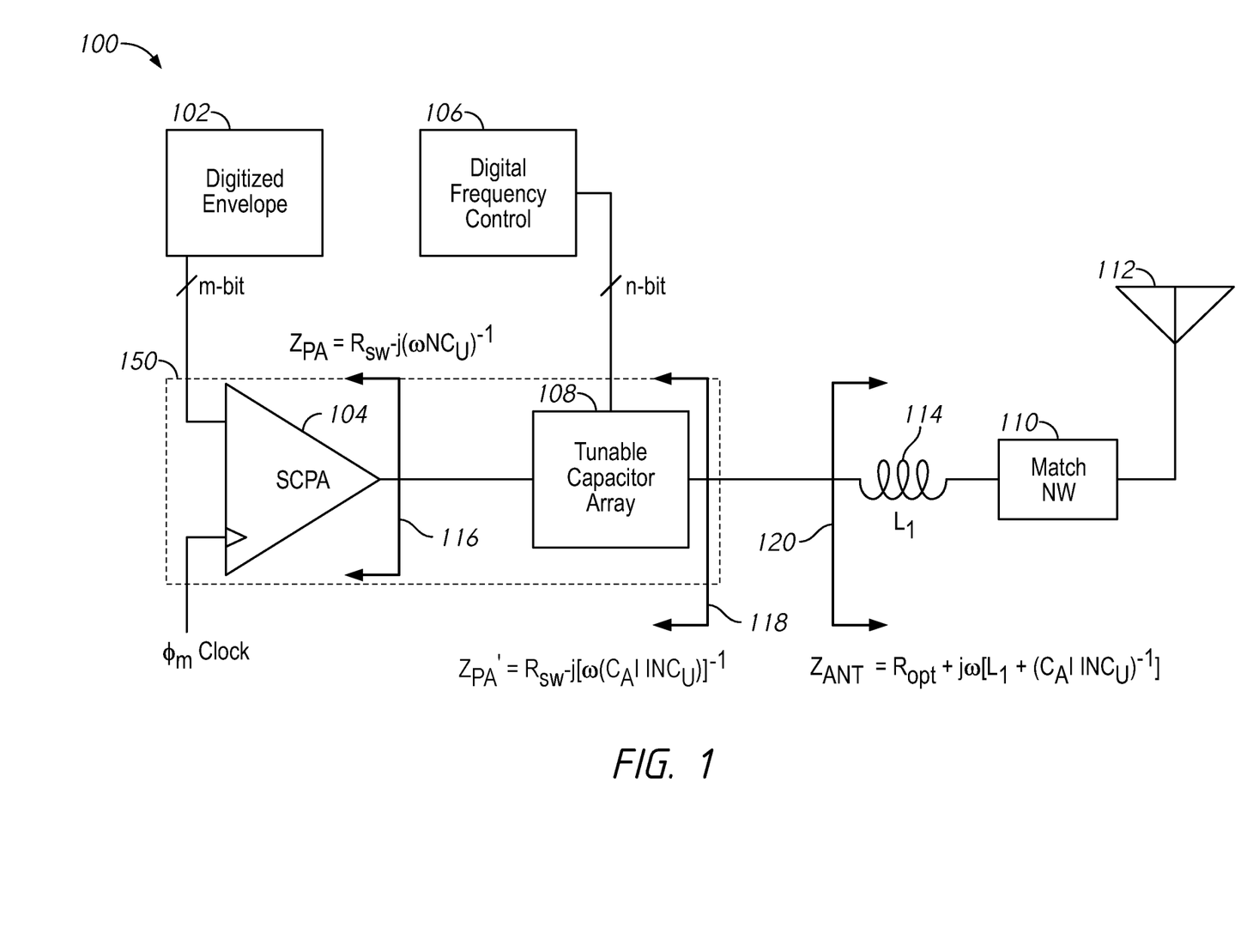
FIG. 1 is a block diagram of an apparatus including a tunable digital power amplifier according to an embodiment of the disclosure.

An apparatus 100 including a tunable digital PA 150 according to an embodiment of the disclosure is shown in FIG. 1. The apparatus 100 may include a digitized envelope circuit 102, an SCPA 104, a digital frequency control circuit 106, a tunable capacitor array 108 (which may also be referred to as a programmable capacitor array), a matching network circuit 110, and an antenna 112. In some embodiments, the tunable digital PA 150 may include the SCPA 104 and the tunable capacitor array 108. The digitized envelope circuit 102, may provide an m-bit signal to the SCPA 104. The SCPA 104 may receive a modulated clock signal ($\phi_m$ Clock) provided by a clock generator (not shown). The SCPA 104 may be coupled in series with the tunable capacitor array 108. The tunable capacitor array 108 may be a digitally programmable capacitor array in some embodiments. The digital frequency control circuit 106 may provide an n-bit control signal to the tunable capacitor array 108. The control signal may control the capacitance of the tunable capacitor array 108. In some embodiments, the digital frequency control circuit 106 may be integrated with the tunable capacitor array 108. The matching network circuit 110 may be coupled in series with the tunable capacitor array 108. In some embodiments, an inductor 114 ($L_1$) may be coupled in series between the tunable capacitor array 108 and the matching network circuit 110. The matching network circuit 110 may be configured to couple the tunable DPA to the antenna 112.

The impedance in various portions of the apparatus 100 are indicated by the equations and arrows 116, 118, and 120. The impedance seen at the output of the SCPA 104 as indicated by arrow 116 is given by the equation:

$$Z_{PA} = R_{SW} - j(\omega N C_U)^{-1} \quad \text{Equation (1)}$$

Where $Z_{PA}$ is the impedance, $R_{SW}$ is the resistance, N is the total number of capacitors in an array of the SCPA 104, w is the phase, and $C_U$ is the capacitance of a unary capacitor in the SCPA 104.

The impedance seen at the output of the tunable capacitor array 108 as indicated by arrow 118 is provided by the equation:

$$Z_{PA}' = R_{SW} - j[\omega(C_A \| N C_U)]^{-1} \quad \text{Equation (2)}$$

Where $Z_{PA}'$ is the impedance, $C_A$ is the capacitance of a configurable capacitor (e.g., the tunable capacitance of the tunable capacitor array 108).

The impedance seen at the inductor 114 as indicated by arrow 120 is provided by the equation:

$$Z_{ANT} = R_{opt} + j\omega[L_1 + (C_A \| N C_U)]^{-1} \quad \text{Equation (3)}$$

Where $Z_{ANT}$ is the impedance, $R_{opt}$ is a resistance (e.g., ohms) of the matching network circuit 110 and/or antenna 112, and $L_1$ is the inductance (e.g., henrys) of the inductor 114.

The apparatus 100 may be capable of outputting high power with high efficiency. It has been shown that the efficiency of an SCPA in backoff may have high performance compared to other non-load-modulated PA topologies. SCPA backoff efficiency may be increased for high quality factor (Q) matching network circuits; however, the maximum loaded Q that can be used may be limited in some applications. For example, losses in the matching network circuit may increase as loaded Q increases when using lossy on-chip components (e.g., spiral inductors). In another example, without a tuning mechanism, high Q networks may result in narrow output power bandwidth.

In some embodiments, the SCPA 104 may be a polar digital power amplifier (DPA). The SCPA 104 may be capable of delivering moderate-to-high power with high average efficiency in some embodiments.

Figure 2:
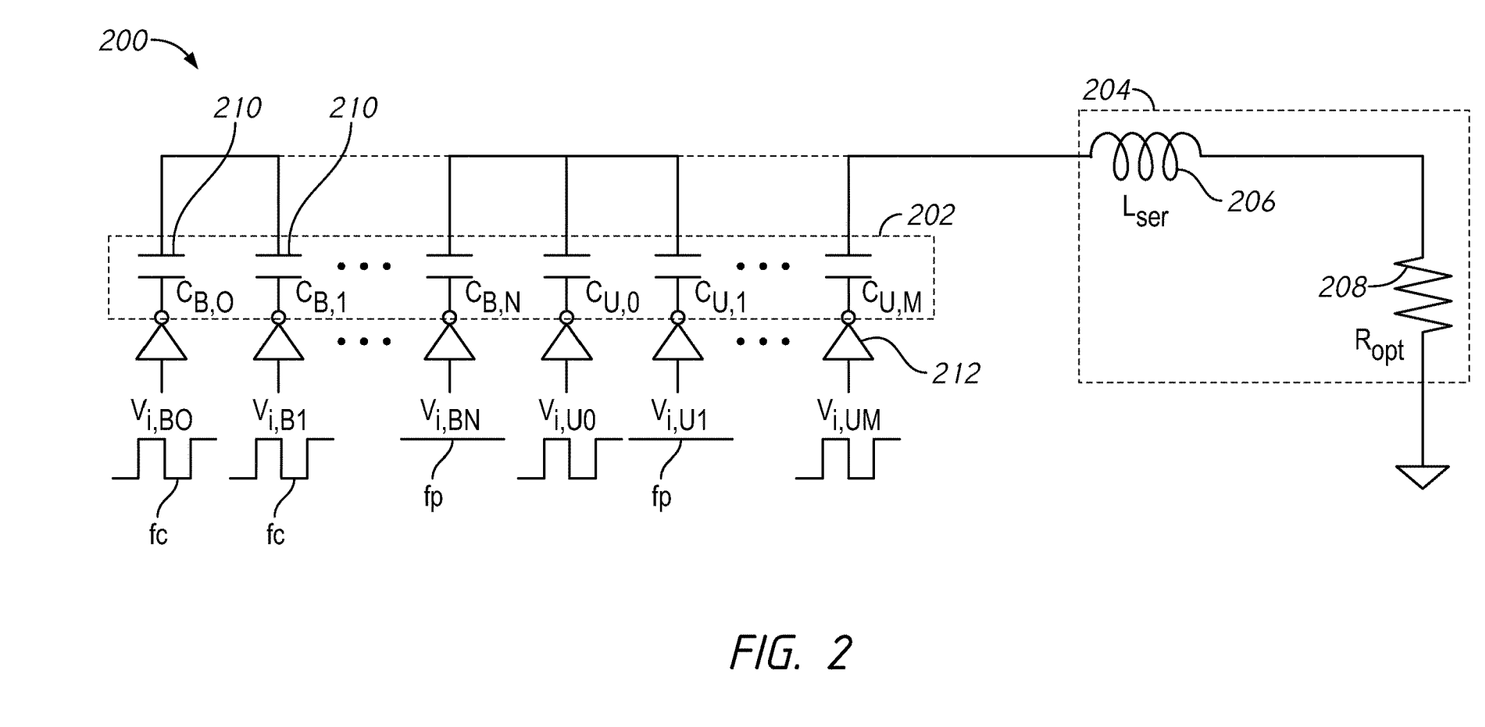
FIG. 2 is a simplified schematic of an output stage of a switched capacitor power amplifier (SCPA) according to an embodiment of the disclosure.

FIG. 2 is a simplified schematic of an output stage of an SCPA 200 according to an embodiment of the disclosure. For context, a bandpass network 204 coupled to the SCPA 200 is also shown. In some embodiments, the output stage of the SCPA 200 may be included in SCPA 104 shown in FIG. 1. In some embodiments, the SCPA 200 may include an array of capacitors 202 where the top plate of all capacitors 210 in the array 202 may be common to all of the capacitors 210. The top plate may be is connected to a bandpass network 204. In some examples, the bandpass network may include an inductor 206 coupled in series with a resistor 208. Alternatively, instead of the bandpass network 204, an impedance matching network (IMN), such as matching network circuit 110, may convert the impedance of an antenna to present an equivalent impedance (e.g., $R_{opt} + j\omega L_{ser}$) to the capacitor array 202. The bottom plate of each of the capacitors 210 in the array 202 may be individually digitally controlled to either switch at a carrier frequency, $f_c$, or can be held at fixed potential, $f_p$ (e.g., ground). In some embodiments, each of the capacitors 210 may be coupled to its own inverter 212, which may act as a switch. The inverters 212 may receive the switching signal and provide the signal to the capacitors 210.

The capacitor array 202 may include a binary portion and a unary portion in some embodiments. In some embodiments, the binary portion and unary portion may be coupled in parallel. In FIG. 2, the capacitors 210 of the binary portion are labeled as $C_B$ and the capacitors 210 of the unary portion are labeled as $C_U$. In the example shown in FIG. 2, there are N binary capacitors and M unary capacitors in the capacitor array 202. In some embodiments, one portion of the array may receive the least significant bits (LSB) of a signal and another portion may receive the most significant bits (MSB) of the signal. In some examples, the binary capacitors $C_B$ may receive the LSB and the $C_U$ may receive the MSB.

In some embodiments, the LSB binary capacitors $C_{B0-N}$ in the array 202 may be designed such that the sum of their capacitance is equivalent to a capacitance of one of the unary capacitors $C_{U0\_M}$. In some embodiments, the SCPA 200 circuit may be modelled as a switch in series with a series resonant resistor-inductor-capacitor (RLC) network, where R is the resistance of resistor 208 $R_{opt}$, L is the inductance of inductor 206 $L_{ser}$, and C is provided by the equation:

$$C_{tot} = C_U + C_B \quad \text{Equation (4)}$$

Where $C_{tot}$ is the total capacitance of the capacitor array 202, $C_U$ is the capacitance of a unary capacitor and $C_B$ is the capacitance of a binary capacitor of the array 202.

In some embodiments, the RLC network may be tuned to be resonant at a carrier frequency $f_c$. The bandpass nature of the RLC network may result in filtering of higher order harmonics so that a sinusoid is delivered to a resistive load.

In some embodiments the output voltage amplitude of the output stage of the SCPA 200 may be controlled by charge redistribution. Momentarily ignoring the binary LSBs for ease of analysis, if nCu capacitors are switched and (N−n) $C_U$ capacitors are held at ground, the output voltage amplitude, $V_{out}$, is given by the following equation:

$$V_{out} = \frac{2}{\pi} \frac{n}{N} V_{DD} \quad \text{Equation (5)}$$

Where $V_{DD}$ is the supply voltage, N is the total number of capacitors in the array, and the coefficient $2/\pi$ is the fundamental weight of the first harmonic in the Fourier expansion of the square wave that switches the capacitors 210. The output power, $P_{out}$, may be calculated as the square of the root mean squared (RMS) voltage delivered to the termination resistor as shown below:

$$P_{out} = \frac{V_{out,rms}^2}{R_{opt}} = \frac{2}{R_{opt}} \left(\frac{nV_{DD}}{\pi N}\right)^2 \quad \text{Equation (6)}$$

In some embodiments, the number of unary capacitors 210 that array 202 is sub-divided into may be based, at least in part, on the signal fidelity requirements (e.g., error vector magnitude, EVM, adjacent channel power ratio, ACLR, etc.), the out-of-band (OOB) noise requirements, and/or the capacitor matching. In some embodiments, the array 202 may include only unary capacitors, divided into a parallel unary sub-array and binary sub-array, split arrays, or C-2C arrays. For explanatory purposes, a binary-weighted LSB array in parallel with the unary-weighted MSB array as shown in FIG. 2 will be described herein, but as noted, alternative arrangements of the capacitor array may also be used.

In some embodiments, the maximum resolution that may be achieved, which may set the limit for the OOB noise, may be dictated by capacitor matching, timing jitter, and/or parasitics in the switches (e.g., inverters 212) and capacitor arrays (e.g., array 202) of the SCPA (e.g., SCPA 200). Hence it may be desirable to have a large array resolution. Using unary weighted capacitors may be preferred for linearity because the identical capacitors in a unary weighted array may match better cell-to-cell; however, the number of capacitors in a unary weighted array grows geometrically with every bit of resolution. Hence, it may be preferable in some applications to sub-divide the array into a parallel array of binary weighted LSBs and unary weighted MSBs to reduce the number of capacitors required.

In some embodiments, a parallel M-bit unary MSB and L-bit binary LSB array may be used, where M is the number of unary capacitors and L is the number of binary capacitors in the array. The parallel unary and binary array may provide moderate output resolution and/or ease of implementation in some applications. The capacitance of the $2^M - 1$ unary weighted capacitors in the MSB may be provided by:

$$C_U = \frac{C_{tot}}{2^M} \quad \text{Equation (7)}$$

The capacitance of the of binary capacitors scales geometrically and is provided by the equation below:

$$C_{B,L-i} = \frac{C_U}{2^{L-i+1}} = \frac{C_{tot}}{2^{M+L-i+1}} \quad \text{Equation (8)}$$

Where i is the $i^{th}$ binary bit from 0-L. The $i^{th}$ binary bit may be scaled by a factor of ½ relative to the preceding bit in some embodiments.

In some embodiments, the power consumption in the output stage of an SCPA may be due to the charging-discharging current through the PA. The input and output power, $P_{SC}$, may be expressed as:

$$P_{SC} = \frac{n(N-n)}{N^2} C_{tot} V_{DD}^2 f_c \quad \text{Equation (9)}$$

The center frequency of operation for the SCPA may be the carrier frequency $f_c$ in some embodiments. $R_{opt}$ may be the optimum termination impedance presented to the PA in some embodiments.

The efficiency, $\eta_{SCPA}$ of the SCPA may be determined by the ratio of the output power to total input power as shown:

$$\eta_{SCPA} = \frac{P_{out}}{P_{SC} + P_{out}} = \frac{4n^2}{4n^2 + \frac{\pi n(N-n)}{Q_{NW}}} \quad \text{Equation (10)}$$

Where $Q_{NW}$ is the loaded quality factor of the matching network, $P_{out}$ is provided in Equation 6, and $P_{SC}$ is provided in Equation 9.

The series inductance, $L_{ser}$, may be a physical inductor (e.g., on-chip spiral, bondwire or off-chip surface mount component, or a combination thereof) in some embodiments. In some embodiments, the series inductance, $L_{ser}$, may be derived as part of an impedance transformation network and may be designed to be resonant with the total capacitance $C_{tot}$ at the carrier frequency G. In these embodiments, the total inductance presented to the capacitor array may be given by:

$$L_{ser} = \frac{1}{(2\pi f_c)^2 C_{tot}} \quad \text{Equation (11)}$$

The analysis provided thus far is for ideal SCPAs, where the switches are assumed to be free of parasitic resistance and capacitance. In reality, there may be conduction loss due to finite resistance in the output stage switch, switching loss due to parasitic capacitance in the complementary metal oxide semiconductor (CMOS) capacitors that may comprise the switch, and/or losses in the resonant networks that are used for impedance transformation. However, the above analysis may provide an adequate approximation for SCPA analysis in some applications.

As noted, the expressions for $P_{out}$ and $\eta_{SCPA}$ may be for the design of an ideal SCPA, but real SCPAs may have finite switch resistance, $R_{SW}$, and the impedance matching network (IMN) that transforms an antenna impedance, $R_{ant}$, to $R_{opt}$ may have finite efficiency. Additionally, because the switch may include a metal oxide semiconductor (MOS) inverter, there may be finite input power, $P_{in}$ and drain power, $P_D$, which may be used to switch the transistors parasitic capacitance. The power dissipated in the switches due to conduction loss, $P_{rsw}$, and switching loss $P_{in}$ and $P_D$, as well as the loss in the matching network, $P_{MNW}$, may be dependent on the output power $P_{out}$ as well as the operating frequency. Optimization may be performed to minimize the losses for the desired output power.

In some embodiments, the SCPA may be designed based on the maximum desired $P_{out}$, as this may be the most difficult condition to meet in some applications. Maximum $P_{out}$ in the SCPA may be achieved for maximum input code (e.g., n=N). For this condition, all of the capacitors and switches of the SCPA may be effectively in parallel.

Figure 3A:
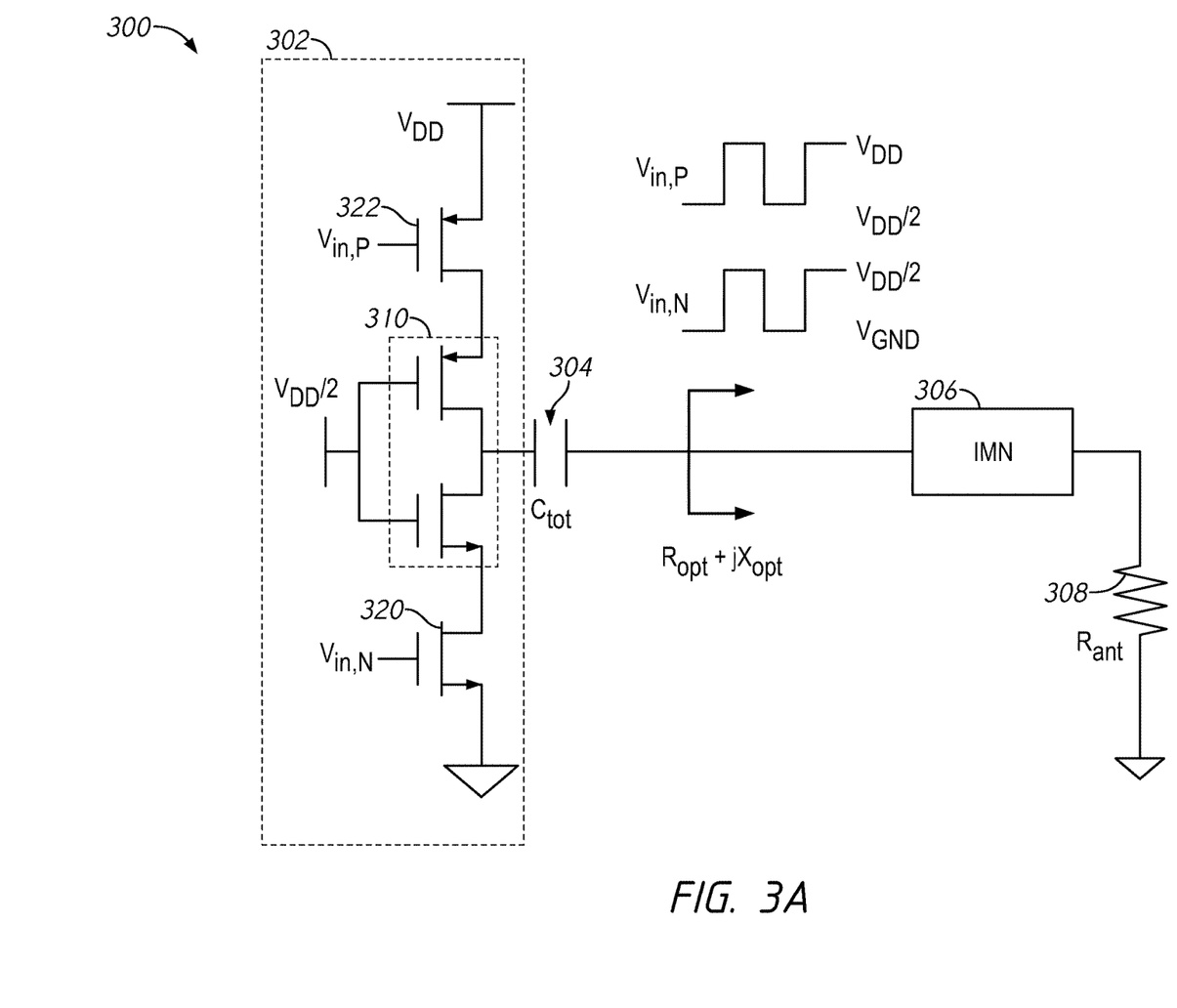
FIG. 3A is a representational circuit diagram of an SCPA with a cascoded switch according to an embodiment of the disclosure.

FIG. 3A is a representational circuit diagram of an SCPA 300 with a cascoded switch 302 according to an embodiment of the disclosure. The SCPA 300 may be included in SCPA 200 and/or SCPA 104 in some embodiments. The representational circuit diagram shown in FIG. 3A may represent operation of the SCPA 300 at full power where all of the capacitors and switches are in parallel. In the circuit diagram shown in FIG. 3A, the peripheries of all the inverters (e.g., inverters 212) of the switches may be summed to realize a single inverter 310 with the equivalent periphery. A capacitor array (e.g., capacitor array 202) is modeled as a single capacitor 304, having a capacitance $C_{tot}$. For context, an impedance matching network circuit (IMN) 306 and an antenna 308 presenting a resistance, $R_{ant}$, are also shown. The IMN 306 and antenna 308 may be coupled in series to the SCPA 300.

Figure 3B:
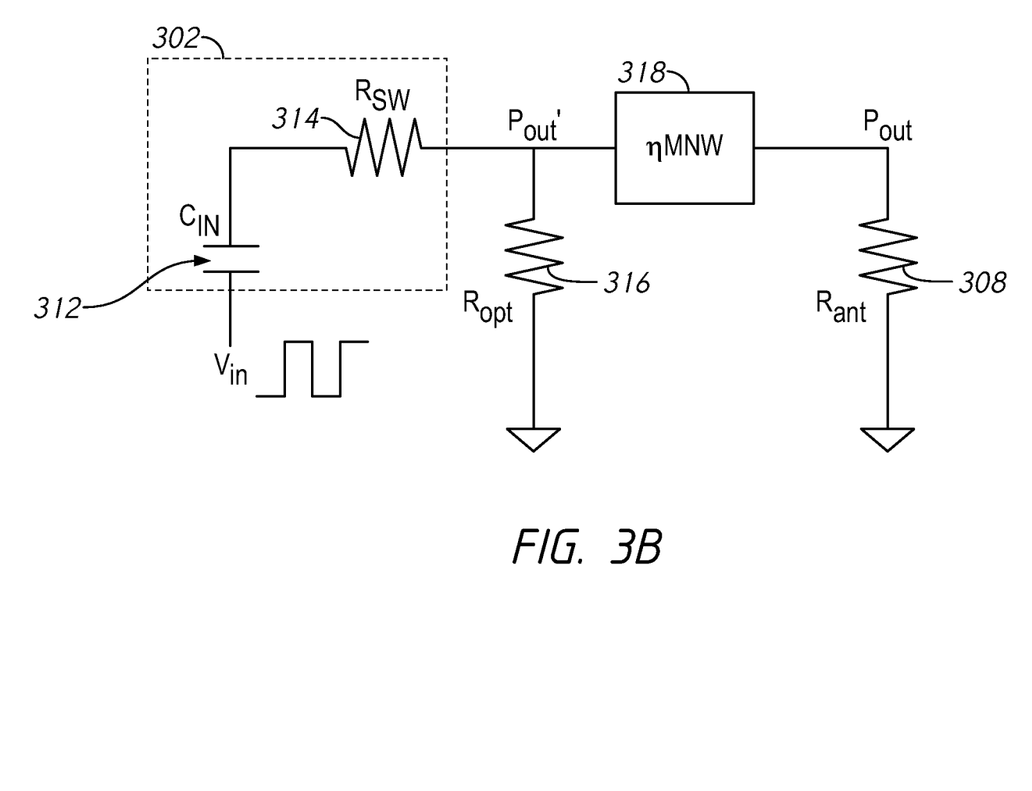
FIG. 3B is a representational circuit diagram of the switch shown in FIG. 3A according to an embodiment of the disclosure.

In the analysis, in some embodiments, it may be assumed that $L_{ser}$ is embedded in the IMN 306 in such a way that it is series resonant with the capacitor 304. Thus, the IMN 306 and capacitor 304 may be replaced by an equivalent short circuit. The switch 302 may be modeled with an equivalent capacitance 312, $C_{in}$, in series with a resistance 314, $R_{SW}$. This model of the switch 302 is shown in FIG. 3B. The resistance 316 and efficiency model block 318 of the IMN 306 is also shown in FIG. 3B.

In some embodiments, using loss estimates for the IMN 306 and/or the switching and conductions losses may help to optimize the size of the switch 302 and to choose the value $C_{tot}$ to optimize the efficiency of the SCPA 300 for a desired network quality factor $Q_{nw}$ and/or bandwidth. Adjusting for the switching resistance 314, the output power generated by the SCPA 300 at full output code (e.g., n=N), $P_o'$, is given by the following:

$$P'_{out} = \frac{2}{R_{opt}} \left(\frac{V_{DD}}{\pi}\right)^2 \eta_{DIV} \qquad \text{Equation (12)}$$

Where $\eta_{DIV}$ represents a power efficiency factor due to the voltage division between $R_{opt}$ and $R_{SW}$ as shown below:

$$\eta_{DIV} = \left(1 + \frac{2R_{SW}}{R_{opt}}\right)^{-2} \qquad \text{Equation (13)}$$

The power dissipated in the switch 302, $P_{SW}$, may be found as follows:

$$P_{SW} = 2P'_{out} \frac{R_{SW}}{R_{opt}} \qquad \text{Equation (14)}$$

In some embodiments, $R_{SW}$ may be due to the channel/on-resistance of the NMOS device 320, $R_{SW,N}$ and PMOS device 322, $R_{SW,P}$, of the switch 302 (See FIG. 3A) and may be given by:

$$R_{SW} = R_{SW,N} = \frac{\rho_N}{W_N} = R_{SW,P} = \frac{\rho_P}{W_P} \qquad \text{Equation (15)}$$

Where $\rho_N$ and $\rho_P$ are the resistivities of the NMOS device 320 and PMOS device 322 device, respectively, and $W_N$ and $W_P$ are the channel widths of the NMOS device 320 and PMOS device 322, respectively. In some embodiments, NMOS device 320 and PMOS device 322 may have different resistivities. In these embodiments, the channel widths of the devices may be adjusted such that the NMOS device 320 and PMOS device 322 have the same resistance. In some embodiments, the channel width may be increased to decrease power dissipated in the switch 302.

The input power, $P_{in}$, may be due to charging and discharging $V_{in,N}$ and $V_{in,P}$ at the gates of the NMOS device 320 and PMOS device 322. In some embodiments, the NMOS device 320 and PMOS device 322 may have the same oxide thickness and may have the same input capacitance. While the NMOS device 320 and PMOS device 322 may be operated at different voltages in some embodiments, the change in charge may be the same magnitude. As a result, $P_{in}$ may be given by:

$$P_{in} = C_{in} V_{DD}^2 f_c \qquad \text{Equation (16)}$$

The input capacitance 312, $C_{in}$, may be the sum of the gate capacitance as shown in:

$$C_{in} = C_{G,N} W_N C_{G,P} W_P \qquad \text{Equation (17)}$$

Where $C_{G,N}$ and $C_{G,P}$ are the gate capacitance per unit width of the NMOS device 320 and PMOS device 322, respectively. $C_{in}$ may be proportional to the width of the channel. Thus, in some embodiments, the channel width should be decreased to decrease power dissipation at the switch 302.

In some embodiments, there may be parasitic capacitance at the drains of the NMOS device 320 and PMOS device 322. The sum of these capacitances, CD, may be charged and discharged during each switching cycle. The power consumed in charging/discharging the sum of this capacitance, $P_D$, is given by the following equations:

$$P_D = C_D V_{DD}^2 f_c \qquad \text{Equation (18)}$$

$$C_D = C_{D,N} W_N C_{D,P} W_P \qquad \text{Equation (19)}$$

Where $C_{D,N}$ and $C_{D,P}$ are the gate capacitance per unit width of the NMOS device 320 and PMOS device 322, respectively. In some embodiments, $P_D$ may be dissipated, not transferred to the output and may reduce the total efficiency of the SCPA, particularly at higher frequencies. To minimize $P_D$, the width of the NMOS device 320 and PMOS device 322 should be reduced.

Losses in the IMN 306 may also be considered in SCPA design. In some embodiments, it may be desirable to minimize the number of matching elements used for a given impedance transformation as this may reduce loss in the inductive components due to finite quality factor, $Q_L$. For exemplary purposes, a two-element IMN 306 is described, but the disclosure is not limited to a two-element IMN. For a two-element IMN for transforming $R_{ant}$ to $R_{opt}$, $Q_{NW}$ may not be controlled independently as shown by:

$$Q_{NW} = \sqrt{\frac{R_{ant}}{R_{opt}} - 1} \qquad \text{Equation (20)}$$

Figure 4:
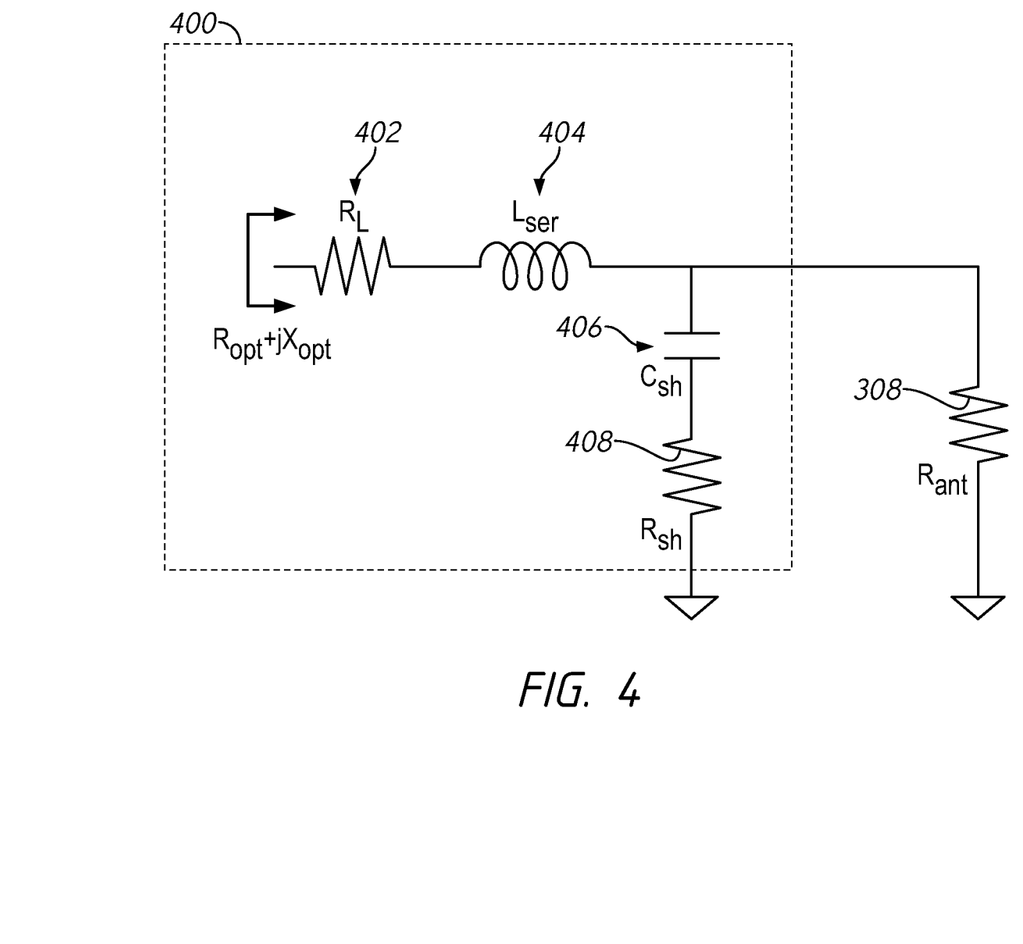
FIG. 4 is a circuit diagram of a two-element up-converting transformation matching network circuit according to an embodiment of the disclosure.

FIG. 4 is a circuit diagram of a two-element up-converting transformation matching network 400 according to an embodiment of the disclosure. The matching network 400 may be included in IMN 306, matching network circuit 110, and/or replace the bandpass network 204 in some embodiments. For example, in some embodiments, the matching network circuit 400 may be included in efficiency model block 318. The matching network 400 may include a resistance 402 coupled in series with an inductance 404. The matching network 400 may further include a capacitance 406 coupled in series with a resistance 408, which may be coupled in parallel with the antenna 308. The efficiency of the matching network 400 may be estimated as:

$$\eta_{MNW} = \frac{1 - \frac{Q_{NW}}{Q_L}}{1 + \frac{Q_{NW}}{Q_C}} \quad \text{Equation (21)}$$

Where component quality factors for the capacitance 406 and inductance 404, $Q_C$ and $Q_L$, respectively, are given by the following:

$$Q_C = \frac{1}{2\pi R_{sh} C_{sh}} \quad \text{Equation (22)}$$

$$Q_L = \frac{2\pi L_{ser}}{R_L} \quad \text{Equation (23)}$$

In some embodiments, QC may be large and the denominator of Equation 21 may be approximated to 1. Substitution of Equation 20 and Equation 23 into Equation 21 yields the following for efficiency of the matching network 400:

$$\eta_{MNW} = 1 - \sqrt{\frac{R_{ant} - R_{opt}}{Q_L^2 R_{opt}}} \quad \text{Equation (24)}$$

The desired output power $P_o$, delivered to the antenna 308, may be equal to the product of Equation 24 and Equation 12 and may be estimated as:

$$P_o \approx 2 R_{opt} \left( \frac{V_{DD}}{\pi(R_{opt} + 2R_{SW})} \right)^2 \left( 1 - \sqrt{\frac{R_{ant} - R_{opt}}{Q_L^2 R_{opt}}} \right) \quad \text{Equation (25)}$$

As noted previously, $P_{SW}$ may be decreased by increasing the channel widths $W_N$ and $W_D$ of the NMOS device 320 and PMOS device 322. However, $P_{in}$ and $P_D$ may be decreased by decreasing the channel widths. Accordingly, in some embodiments, a convex optimum for device width to maximize energy efficiency for a given output power may exist. The total drain efficiency, TOT may be found by:

$$\eta_{TOT} = \frac{P_o}{P_{out} + P_{SW} + P_D} \quad \text{Equation (26)}$$

Thus, the total efficiency of SCPA 300, $PAE_{TOT}$, may be given by the following:

$$PAE_{TOT} = \frac{P_{out}}{P_{out} + P_{SW} + P_{in} + P_D} \quad \text{Equation (27)}$$

Figure 5:
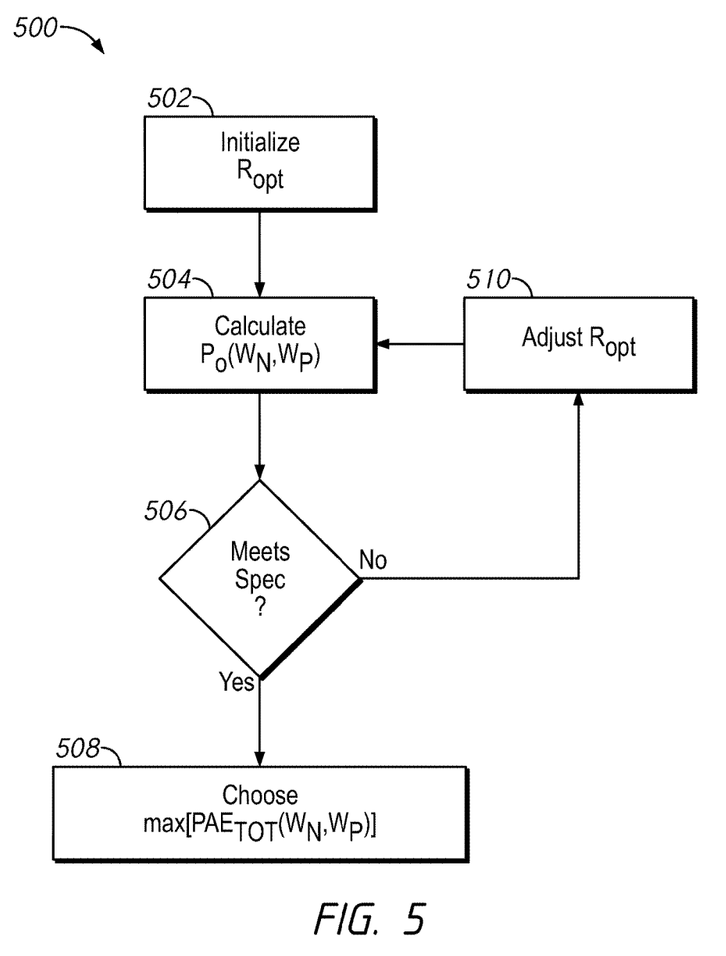
FIG. 5 is a flow chart of a method according to an embodiment of the disclosure.

FIG. 5 is a flow chart of a method 500 for designing the output stage of an SCPA according an embodiment of the disclosure. The method 500 may be used for designing the SCPA 104, the SCPA 200, and/or SCPA 300 in some embodiments.

At block 502, an initial value for $R_0$ is selected. At block 504, the output power $P_o$, is calculated using Equation 25 for the selected $R_{opt}$, as a function of device width (e.g., $W_N$ and $W_P$). At block 506, it is determined whether or not $P_o$ calculated at block 504 meets the specification for a desired output power $P_o$. Meeting the specification may mean that the $P_o$ calculated at block 504 is equal to or greater than the desired output power. If the power requirement is met, at block 508, Equation 27 may be used to determine the values of $W_N$ and $W_P$ that maximizes $PAE_{TOT}$. If the power requirement is not met, $R_{opt}$ is adjusted (e.g., increased or decreased) at block 510 and blocks 504 and 506 are repeated. The steps 504, 506, and 510 may be repeated until the design meets the specification for the desired output power.

In an illustrative example, using a 65 nm CMOS process, a SCPA was designed having the following characteristics: $\rho_N$=435Ω μm, $\rho_P$=1111Ω μm, $C_{G,N}$=$C_{G,P}$=3 fF/μm, $C_{D,N}$=0.216 fF/μm, $C_{D,P}$=0.226 fF/μm. This is provided only as an example, and the disclosure is not limited to this particular SCPA design.

There may be multiple way to tune a series resonant circuit of a frequency tunable digital PA of the present disclosure. Tuning the series resonant circuit including an SCPA may enable continuous operation across a wide range of frequencies. In some applications, it may be difficult to realize a variable inductor at radio frequencies (RF), a tunable matching network may be synthesized using floating CMOS switched capacitors in some embodiments. The floating switches may be physically large, which may reduce switch resistance. Furthermore, an independent well around each switch may be desirable, which further increases the size. Thus, if there are die area constraints, only a few switches may be used. Furthermore, the number of switches may be limited due to parasitics. Thus, in some embodiments, the number of discrete frequency bands that are covered may be limited.

Figure 6:
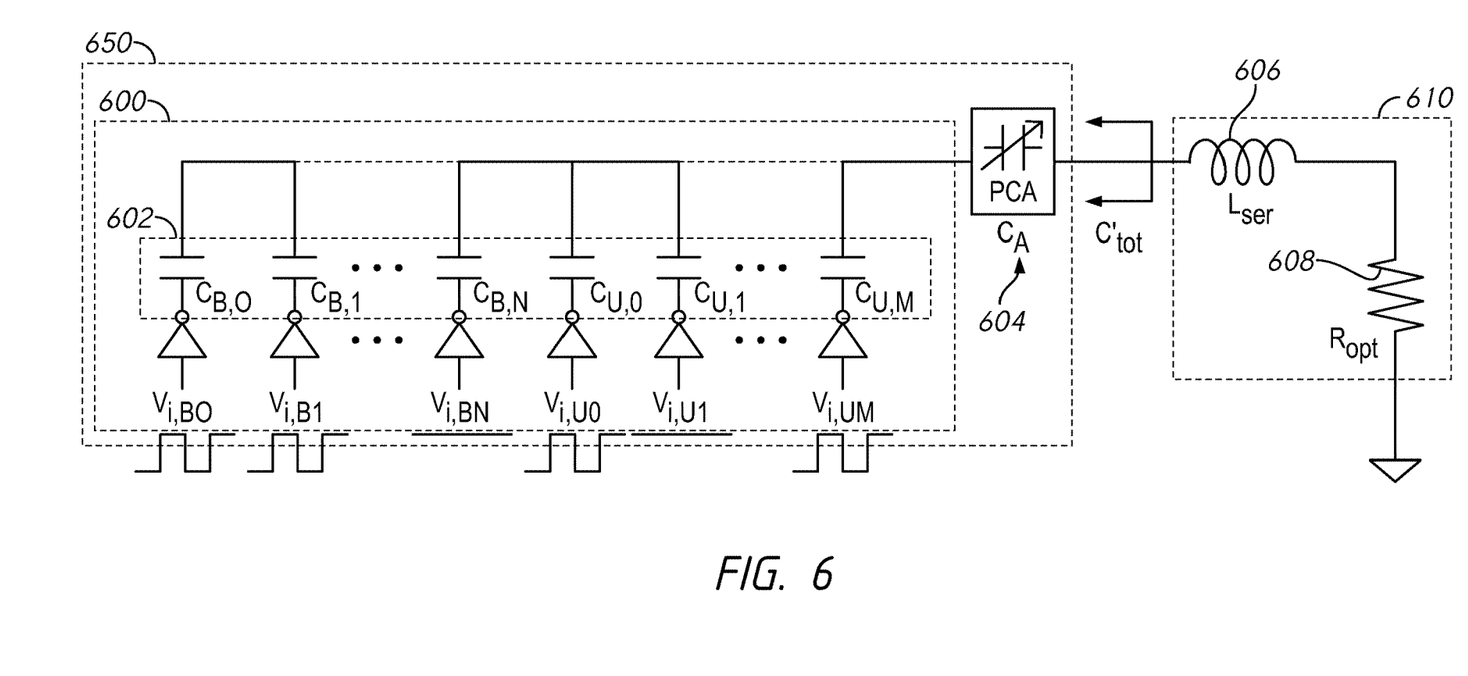
FIG. 6 is a circuit diagram an output stage of an SCPA and a reconfigurable capacitor as part of a digital power amplifier according to an embodiment of the present disclosure.

In another technique for frequency tuning for a digital PA according to embodiments of the present disclosure, may include changing the total capacitance that is resonant using a reconfigurable capacitor. FIG. 6 is a circuit diagram an output stage of an SCPA 600 and a reconfigurable capacitor 604 as part of a digital power amplifier 650 according to an embodiment of the present disclosure. In some embodiments, the reconfigurable capacitor 604 may be coupled in series with a capacitor array 602 of the SCPA 600. The SCPA 600 includes several components that are similar or equivalent to the components of SCPA 200, such as the capacitor array 602 that includes both unary and binary portions. For brevity, these components will not be described again in reference to FIG. 6. A band pass network 610, which may include an inductor 606 and a resistance 608, is also shown in FIG. 6 for context. In some embodiments, bandpass network 610 may be included in matching network 400, IMN 306, matching network circuit 110, and/or bandpass network 204.

In some embodiments, placing the reconfigurable capacitor 604 in series with the capacitor array 602 may not impact the amplitude control of the capacitor array 602. In some embodiments, this may be due, at least in part, to the charge from the array 602 being distributed across the reconfigurable capacitor 604. In some embodiments, the total capacitance seen by the inductor 606, $C^1_{TOT}$ may be the parallel combination of the capacitance of the reconfigurable capacitor 604, $C_A$, and $C_{tot}$, where $C_{tot}$ is the total capacitance of the capacitor array 602.

To incorporate frequency tuning into the digital PA 650, in some embodiments, reconfigurable capacitor 604 may be implemented using a variable/programmable capacitor (e.g., a programmable capacitor array). Suitable programmable capacitor arrays (PCAs) may be obtained from MMIC and/or MEMS manufacturers. A PCA may provide a wide tuning range and/or moderate to high quality factor. With a MEMS capacitor, the possibility of back-end-of-line (BEOL) fabrication may yield compact solutions. Because the reconfigurable capacitor 604 is placed before any matching network (e.g., bandpass network 610), the voltage stress on the reconfigurable capacitor 604 may be limited. Thus, in some embodiments, the reconfigurable capacitor 604 may be implemented using a CMOS varactor, but the quality factor may be reduced in some applications.

In some embodiments, tuning by adjusting the capacitance $C_A$ of the reconfigurable capacitor 604 may not impact linearity of the SCPA 600. As the reconfigurable capacitor 604 is changed, the output center frequency may be changed, but the amplitude may be only minimally impacted. In some embodiments, this may be due, at least in part, to differences in transistor parasitics. In some embodiments, the half power code may shift in frequency by the same amount as the full power code. In some embodiments, the −3 dB bandwidth may be unchanged. In some embodiments, this may be due to a fixed ratio of the inductive reactance to the resistance.

In some embodiments, the parameters that may impact the output frequency of the SCPA 600 may be related to the resonance of the inductors and capacitors in the bandpass network 610. In some embodiments, $R_{opt}$ may be synthesized from the antenna impedance using a passive matching network. In some cases, this may add additional frequency dependence, for example, where an LC-balun is used to synthesize $R_{opt}$ and convert from single-ended to differential signaling. These frequency effects may be incorporated in the model above by simulating the insertion loss of the circuit, including any lossy effects from a printed circuit board (PCB), across frequency, $IL_{MNW}(f)$. If $IL_{MNW}(f)$ is expressed as a linear power ratio, it may be used to directly replace $\eta_{MNW}$ in Equation 24 in some embodiments.

In addition to the frequency response of the matching network (e.g., bandpass network 610), in some embodiments, the SCPAs may also exhibit sensitivity to operation frequency through both $P_{in}$ and $P_D$, as well as any variation in $R_{opt}$. In some applications, this may be due in part to the finite frequency response of the matching network. To understand the impact of frequency on the performance of the SCPA, may be optimized using the method 500 of FIG. 5 for $P_o$=21 dBm at frequencies across the intended output range. $PAE_{TOT}$ may be plotted versus the total transistor periphery for operating frequencies across an intended band of operation (e.g., 1.5-2.5 GHz). For example, the efficiency may vary by ~7% from 46-53% for an optimal design across a intended frequency range of 1.5-2.5 GHz.

Figure 7:
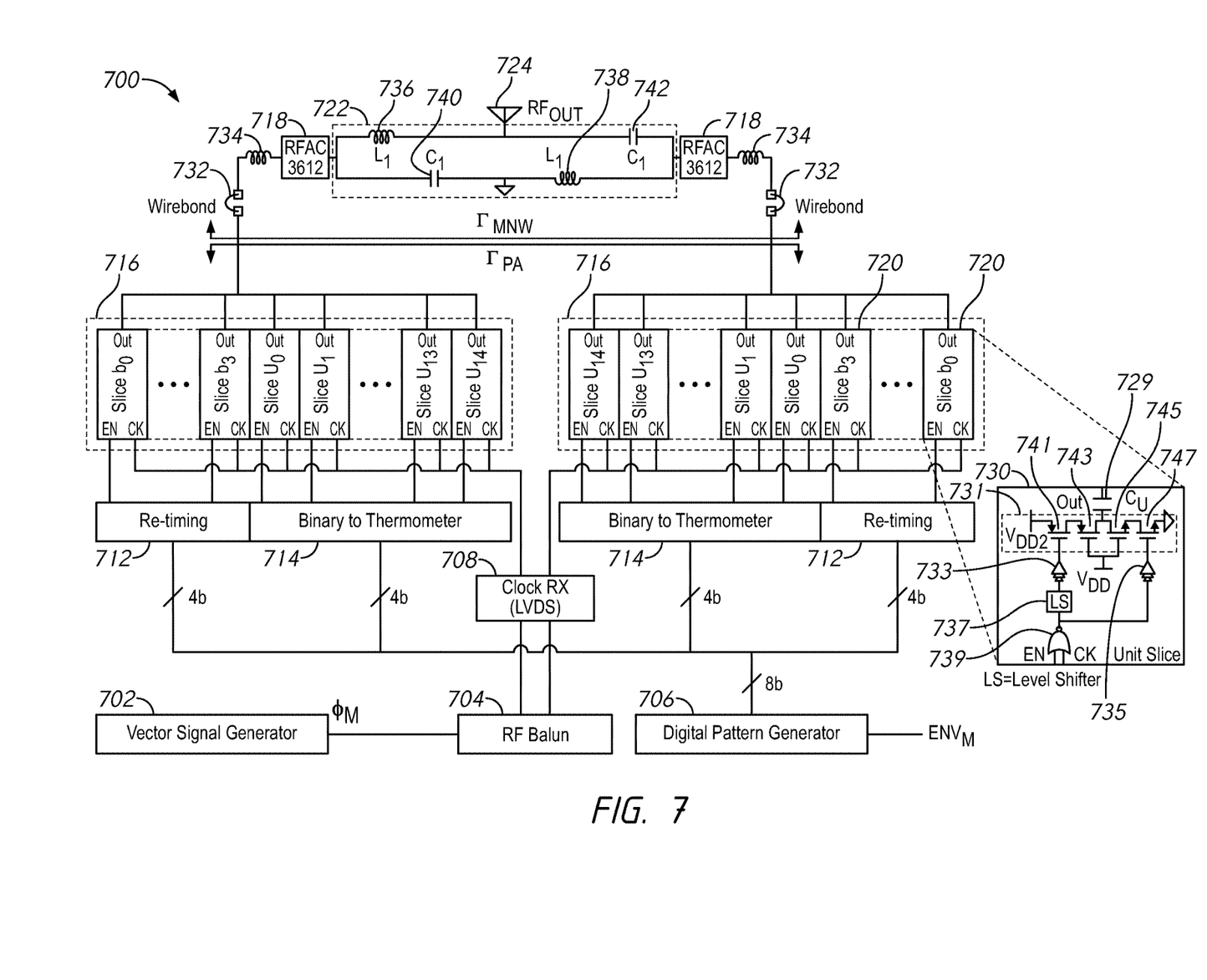
FIG. 7 is a schematic of an apparatus including a frequency tunable digital PA according to an embodiment of the disclosure.

FIG. 7 is a schematic of an apparatus 700 including a frequency tunable digital PA according to an embodiment of the disclosure. The apparatus 700 may be used to implement the apparatus 100 in some embodiments. The apparatus 700 may include a vector signal generator 702, a radio frequency (RF) balun 704, a digital pattern generator 706, a low voltage differential signaling (LVDS) clock 708, a re-timing circuit 712, a binary-to-thermometer circuit 714, an SCPA 716, a programmable capacitor array (PCA) 718, a matching network 722, and an antenna 724. The embodiment shown in FIG. 7 is designed to provide a differential output signal, and certain components, such as the SCPA 716 and PCA 718, are provided for both portions of the differential signal. For brevity, the components provided for both portions of the differential signal will only be described once. Furthermore, the disclosure is not limited to apparatuses with differential outputs.

In some embodiments, the vector signal generator 702 may provide a modulated signal (km to the RF balun 704, which may provide the modulated signal (km to the LVDS clock 708, which may then provide a modulated clock signal CK to the SCPA 716. In some embodiments, a symmetric H-tree is used to distribute the clock signal CK to the SCPA 716. The digital pattern generator 706 may be used to implement a digitized envelope circuit and provide a multi-bit signal to the SCPA 716 based on an input signal $ENV_M$. In the example shown in FIG. 7, the digitized envelope signal is an 8 bit signal. However, the envelope signal may be any number of bits (e.g., 4 bit, 16 bit).

The re-timing circuit 712 and binary-to-thermometer circuit 714 may be used to implement a polar modulator circuit. In some embodiments, the re-timing circuit 712 may included one or more buffer chains. The buffer chains may match the delays between the binary and unary control signals. The re-timing circuit 712 and binary-to-thermometer circuit 714 may each receive four bits of the 8 bit signal from the digital pattern generator 706. The re-timing circuit 712 and binary-to-thermometer circuit 714 may provide polar modulated signals to the SCPA 716. Thus, the SCPA 716 may be implemented as a polar SCPA 716. The SCPA 716 may include a plurality of slices 720. In some examples, the slices 720 may be designed to be tiled directly adjacent to another slice 720. This may minimize routing parasitics in some embodiments. Each slice 720 may include a capacitor of a capacitor array of the SCPA 716. In some embodiments, such as the one shown in FIG. 7, the capacitor array includes a binary portion (e.g., Slice $b_{0-3}$) and a unary portion (e.g., Slice $U_{0-14}$). Although the example shown in FIG. 7 includes four binary slices and 15 unary slices, the SCPA 716 may include any number of binary slices and/or unary slices. In some embodiments, the number of slices 720 and the ratio of binary slices to unary slices may be based, at least in part, on a number of bits provided by the digital pattern generator 706, size constraints, and/or desired resolution of the SCPA 716. Each slice 720 of the binary portion may receive a signal from the re-timing circuit 712 and each slice 720 of the unary portion may receive a signal from the binary-to-thermometer circuit 714. In some embodiments, the binary portion may receive the LSB and the unary portion may receive the MSB of the signal.

Block 730 shows a schematic illustration of a slice 720 of the SCPA 716. Each slice 720 may include a capacitor 729 coupled to a switch 731. The switch 731 may be a cascoded inverter in some embodiments, such as the one shown in FIG. 7. In some embodiments, the switch 731 may include one or more transistors. In the example shown in FIG. 7, the switch 731 includes two PMOS devices 741, 743 and two NMOS devices 745, 747. PMOS device 743 and NMOS device 745 may be biased by a voltage source, such as $V_{DD}$. NMOS device 747 may be switched between a reference voltage (e.g., $V_{GND}$) and the voltage source, e.g., $V_{DD}$. PMOS device 741 may be switched between the voltage source, $V_{DD}$ and another voltage source (e.g., $V_{DD2}$). In some embodiments, the voltage source $V_{DD2}$ may provide a voltage that is greater in magnitude than a voltage provided by $V_{DD}$. The switch 731 may be preceded by a high side driver 733 and a low side driver 735. In some embodiments, the drivers 733, 735 may include a cascade of CMOS inverters. In some embodiments, the high side driver 733 may be preceded by a level shifter (LS) 737. In some embodiments, the paths are sized using an alternating taper of ⅔ starting from a minimum sized inverter up to the switch 731. However, other tapers may be used in other embodiments. In some embodiments, the paths may be delay matched to deliver 50% duty cycle waveforms to the switch 731 with minimal overlap, which may reduce crow-bar current in some applications. The switch 731 may be controlled by control logic 739. The control logic 739 may receive the clock signal CK from the LVDS clock 708 and an enable signal EN from the binary-to-thermometer circuit 714 or the re-timing circuit 712, which may be based on the signal provided by the digital pattern generator 706. In the example shown in FIG. 7, the control logic 739 is a NOR circuit. However, in other examples, other control logic may be used. Thus, the capacitor 729 of each slice of the SCPA 716 may be selectively activated.

The SCPA 716 may be coupled to the PCA 718 to provide a tunable digital power amplifier according to the present disclosure. In some embodiments, a Qorvo RFCA3612 PCA may be used to implement the PCA 718. However, other PCAs from other manufacturers may be used. The capacitance of the PCA 718 may be adjusted (e.g., programmed) to tune the operating frequency of the SCPA 716. However, in some embodiments, such as the one shown in FIG. 7, the PCA 718 and SCPA 716 may not be directly coupled.

In some embodiments, a bondwire inductance 732 may be included in series with the SCPA 716 and a surface mount inductor 734. In some embodiments, the inductance $L_2$ of inductor 734 may be selected such that the inductor 734 and bondwire inductance 732 resonate with the total capacitance, $C_{tot}$, of the SCPA 716 (e.g., see Equation 4). The PCA 718 may be coupled in series between the inductor 734 and the matching network 722.

In the example implementation shown in FIG. 7, the signal is differential, and a surface mount LC balun may be included in the matching network 722 to convert the output signal from differential to single-ended, as well as perform impedance transformation. The matching network 722 may include inductors 736, 738 and capacitors 740, 742. The inductance $L_1$ and capacitance $C_1$ may be selected based on a desired center frequency and to convert the single-ended impedance of the antenna 724 into a differential impedance. Wider bandwidth baluns may be implemented using transmission lines, however, this may come at the expense of cost. Furthermore, transmission lines may not offer an option to center the design after manufacturing the PCB.

In an example implementation, the SCPA 716 may be optimized to operate in a range from 1.5-2.5 GHz, drive a single ended resistance, $R_{opt}$=6.25Ω, and provide an output power of >20 dBm when losses in the switch 731 and matching network 722 are accounted for. The capacitance of a unit capacitor may have a capacitance $C_U$=87.5 fF so that the total capacitance of all of the slices 720 is 1.4 pF. This may provide a quality QNW of approximately 12. This may maximize efficiency of the SCPA 716 in some embodiments. The switch 731 may be optimized using the method described with reference to FIG. 5. In this example implementation, the NMOS devices 745, 747 may have channel widths of 77 μm and the PMOS devices 741, 743 may have channel widths of 234 μm. The total transistor periphery may be 4.98 mm. In this implementation, the pull-up resistance of the PMOS devices 741, 743 may be matched to the pull-down resistance of the NMOS devices 745, 747. In some embodiments, $V_{DD}$=1.2 V and $V_{DD}2$=2.4 V. In the matching network 722, $L_1$=2.2 nH and $C_1$=4.5 pF. These values may be chosen for operation at a center frequency of 2.1 GHz and convert the impedance of the antenna 724, which may be 50Ω in this implementation, to a differential impedance of 12.5Ω. The PCA 718 may be a 6-bit programmable capacitor with capacitances ranging from 0.5-13 pF in steps of 0.2 pF. Thus, the total capacitance of the tunable digital PA, that is the combined capacitance of the SCPA 716 and PCA 718, may range from 0.37-1.26 pF. This range of capacitances may resonate with the combination of the wire bond inductance 732 (approximately 2.75 nH) and the inductor 734, where $L_2$=3.3 nH, and the package inductance from the PCA 718. This implementation is provided merely for exemplary purposes and the disclosure is not limited to this particular implementation.

The apparatuses, systems, and methods disclosed herein may provide a narrowband tunable digital power amplifier (DPA) that can operate at multiple narrow band segments within a larger frequency range. The tunable DPA may include a switched capacitor power amplifier (SCPA) and a reconfigurable capacitor, such as a programmable capacitor array (CPA). The SCPA and CPA may be coupled in series. The tunable DPA disclosed herein may provide a cost-effective and/or area-efficient technique to leverage use of the available fragmented spectrum. The tunable DPA according to embodiments disclosed herein may not significantly sacrificing output power, linearity, and/or efficiency.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus, comprising:
   a digital power amplifier, wherein the digital power amplifier includes a switched capacitor power amplifier (SCPA) including a unary capacitor array and a binary capacitor array, wherein capacitors of the binary capacitor array are configured to receive least significant bits of a signal and capacitors of the unary array are configured to receive most significant bits of the signal; and
   a reconfigurable capacitor coupled in series with the digital power amplifier, wherein the reconfigurable capacitor is configured to tune a resonant frequency of the digital power amplifier.

2. The apparatus of claim 1, wherein the reconfigurable capacitor includes an array of capacitors.

3. The apparatus of claim 1, wherein the unary capacitor array and the binary capacitor array are coupled in parallel.

4. The apparatus of claim 1, wherein the SCPA includes a switch configured to selectively activate a capacitor of the SCPA.

5. The apparatus of claim 4, wherein the switch includes a cascoded inverter.

6. The apparatus of claim 4, further comprising a control logic circuit configured to control the switch.

7. The apparatus of claim 1, further comprising a matching network coupled in series with the reconfigurable capacitor, wherein the matching network is configured to couple the apparatus to an antenna.

8. The apparatus of claim 7, wherein the matching network includes an LC balun.

9. The apparatus of claim 7, wherein the matching network includes an inductor and a resistance.

10. The apparatus of claim 1, further comprising an inductor coupled between the digital power amplifier and the reconfigurable capacitor.

11. An apparatus comprising:
a digital power amplifier;
a reconfigurable capacitor coupled in series with the digital power amplifier, wherein the reconfigurable capacitor is configured to tune a resonant frequency of the digital power amplifier;
a vector signal generator configured to generate a phase modulated signal; and
a clock circuit configured to provide a modulated clock signal, based at least in part on the phase modulated signal, to the digital power amplifier.

12. An apparatus comprising:
a digital power amplifier;
a reconfigurable capacitor coupled in series with the digital power amplifier, wherein the reconfigurable capacitor is configured to tune a resonant frequency of the digital power amplifier; and
a binary-to-thermometer circuit configured to provide most significant bits of a signal to the digital power amplifier and a re-timing circuit configured to provide least significant bits of the signal to the digital power amplifier.

13. A method for designing an output stage of a switched capacitor array power amplifier (SCPA), the method comprising:
selecting a value for a resistance;
calculate an output power as a function of a channel width of an NMOS device and a channel width of a PMOS device;
compare the output power to a desired output power; and
if the output power meets a specification for the desired output power, calculate the channel width of the NMOS device and the channel width of the PMOS device that maximizes a total efficiency of the SCPA; or
if the output power does not meet the specification for the desired output power, adjust the value of the resistance.

14. The method of claim 13, further comprising repeating the method of claim 13 until the output power meets the specification for the desired output power.

15. The method of claim 13, wherein meeting the specification for the desired output power comprises the output power is equal to or greater than the desired output power.

16. The method of claim 13, wherein adjusting the value of the resistance comprises reducing the value.

* * * * *